(12) United States Patent
Kikkawa et al.

(10) Patent No.: US 8,193,539 B2
(45) Date of Patent: Jun. 5, 2012

(54) COMPOUND SEMICONDUCTOR DEVICE USING SiC SUBSTRATE AND ITS MANUFACTURE

(75) Inventors: Toshihide Kikkawa, Kawasaki (JP); Kenji Imanishi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 12/889,724

(22) Filed: Sep. 24, 2010

(65) Prior Publication Data
US 2011/0073873 A1 Mar. 31, 2011

Related U.S. Application Data

(62) Division of application No. 12/359,747, filed as application No. PCT/JP2006/314743 on Jul. 26, 2006, now Pat. No. 7,875,535.

(51) Int. Cl.
*H01L 29/24* (2006.01)
(52) U.S. Cl. ............ 257/77; 257/190; 257/E29.091; 257/E29.104
(58) Field of Classification Search ........... 257/E21.091, 257/E21.093, E21.097, E29.091, E29.104, 257/190, 77
See application file for complete search history.

(56) References Cited

U.S. PATENT DOCUMENTS

| 6,703,649 B2 | 3/2004 | Shibata et al. | |
|---|---|---|---|
| 6,984,841 B2* | 1/2006 | Tsuda et al. | 257/12 |
| 2006/0226412 A1* | 10/2006 | Saxler et al. | 257/11 |

FOREIGN PATENT DOCUMENTS

| JP | 2002-359255 A | 12/2002 |
|---|---|---|
| JP | 2003-309071 A | 10/2003 |
| JP | 2004-524690 A | 8/2004 |
| JP | 2004-342810 A | 12/2004 |
| JP | 2005-252248 A | 9/2005 |
| WO | 02/069376 A1 | 9/2002 |

OTHER PUBLICATIONS

International Search Report of PCT/JP2006/314743, mailing date fo Oct. 31, 2006.

* cited by examiner

*Primary Examiner* — Zandra Smith
*Assistant Examiner* — Paul Patton
(74) *Attorney, Agent, or Firm* — Westerman, Hattori, Daniels & Adrian, LLP

(57) ABSTRACT

A compound semiconductor device includes: a conductive SiC substrate; an AlN buffer layer formed on said conductive SiC substrate and containing Cl; a compound semiconductor buffer layer formed on said AlN layer which contains Cl, said compound semiconductor buffer layer not containing Cl; and a device constituent layer or layers formed above said compound semiconductor buffer layer not containing Cl.

19 Claims, 9 Drawing Sheets

US 8,193,539 B2

COMPOUND SEMICONDUCTOR DEVICE USING SIC SUBSTRATE AND ITS MANUFACTURE

CROSS REFERENCE TO RELATED APPLICATION

This application is a divisional of U.S. application Ser. No. 12/359,747, filed on Jan. 26, 2009 now U.S. Pat. No. 7,875,353 which is a continuation application of an international application PCT/JP2006/314743 filed on Jul. 26, 2006, the whole contents of which are incorporated herein by reference.

FIELD

The present invention relates to a compound semiconductor device and its manufacture method, and more particularly to a compound semiconductor device using a SiC substrate and its manufacture method. In addition, a system using a compound semiconductor device is also related.

The term "gallium nitride (GaN) based compound semiconductor" means $Al_xIn_yGa_{1-x-y}N$ ($0 \leq x \leq 1.0$, $0 \leq y \leq 1.0$).

BACKGROUND

Compound semiconductor devices using GaN or GaN based compound semiconductor are under active development. GaN has a wide band gap of 3.4 V allowing a high voltage operation. Various types of semiconductor devices can be manufactured by forming a hetero junction of GaN based compound semiconductor. Metal organic chemical vapor deposition (MOCVD) is mainly used as a crystal growth method for the GaN based compound semiconductor. A method called hydride vapor phase epitaxy (H-VPE) has been under research recently, which method grows nitride semiconductor by reacting HCl and group III metal to form metal chloride which is further reacted with ammonia or the like to form nitride semiconductor.

A semiconductor light emitting device using GaN based compound semiconductor can emit blue or ultraviolet light, and can form a white light source by using phosphors. Various light emitting devices are manufactured by growing GaN based compound semiconductor crystal on a sapphire substrate or on a SiC substrate.

GaN has a high breakdown voltage, and is expected for applications in a field requiring a high voltage operation and a high speed operation such as high electron mobility transistors (HEMT) used in a mobile phone base station. In addition, GaN is also expected for inverter/converter related systems such as power supply, car control unit, power plant. Various types of GaN-HEMT have been reported having a GaN layer as an electron transfer or channel layer among GaN/AlGaN crystal layers grown on a substrate such as sapphire, SiC, GaN and Si. A breakdown voltage over 300 V in a current-off state is presently reported. The best output characteristics are now obtained in GaN-HEMT using a SiC substrate. A high thermal conductivity of SiC is considered to contribute to this performance. In manufacturing a high speed operation GaN device, a semi-insulating SiC substrate is used to suppress a parasitic capacitance. However, a price of a semi-insulating single crystal SiC substrate is high, which may possibly hinder the spread of GaN based semiconductor devices. A conductive SiC substrate is available at a lower price than a semi-insulating SiC substrate. However, when a semiconductor device is formed on a conductive SiC substrate, parasitic capacitance increases.

JP-A-2002-359255 proposes to grow, as an underlying layer, an AlN layer to a thickness of 2 μm on a conductive SiC substrate having resistivity smaller than $1 \times 10^5$ Ωcm by metal organic chemical vapor deposition (MOCVD) and form device constituent layers on the underlying layer.

JP-A-2003-309071 proposes to grow an AlGaN underlying layer above a crystal substrate such as sapphire and SiC via an AlN low temperature growth buffer layer by MOCVD and form an AlGaN layer on the underlying layer.

International Publication No. 2004-524690 proposes a hybrid growth system capable of growth in an MOCVD mode and growth in an H-VPE mode in the same chamber and capable of growth in both the modes.

JP-A-2005-252248 proposes to suppress a growth chamber temperature not higher than 750° C. not forming deposition and maintain a substrate at a temperature of 900° C. to 1700° C. by high frequency heating, during H-VPE growth of AlN crystal on a sapphire substrate or on a Si substrate.

MOCVD is difficult to make the growth speed high, and is not suitable for growth of a thick GaN based semiconductor layer. Although it is known that H-VPE has the merit of a high growth speed, H-VPE is a crystal growth method under development, and there are some future issues of findings of problematic points, their solutions and the like.

SUMMARY

According to aspects of the present invention, there is provided a compound semiconductor device including:
 a conductive SiC substrate;
 an AlN layer containing Cl and formed on the conductive SiC substrate;
 an AlN layer not containing Cl and formed on the AlN layer containing Cl; and
 a device constituent layer or layers formed above the AlN layer not containing Cl.

According to another aspect of the present invention, there is provided a method for manufacturing a compound semiconductor device comprising steps of:
 (1) growing a first AlN buffer layer by H-VPE on a conductive SiC substrate;
 (2) growing a second AlN buffer layer by MOCVD on the first AlN buffer layer; and
 (3) growing a device constituent layer or layers by MOCVD above the second AlN buffer layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

The patent or application file contains at least one drawing executed in color. Copies of this patent or patent application publication with color drawing(s) will be provided by the Office upon request and payment of the necessary fee.

DESCRIPTION OF EMBODIMENTS

A price of a semi-insulating SiC substrate is very high, which may possibly hinder the spread of GaN-HEMT's. A conductive SiC substrate is available at a lower price than a semi-insulating SiC substrate. If GaN based semiconductor devices having good electrical characteristics can be formed by using a conductive SiC substrate, this contributes to the spread of GaN based semiconductor devices.

If a conductive SiC substrate is used, it is possible to form inexpensive GaN based compound semiconductor devices having a SiC high thermal conductivity. However, as the conductive substrate is used, parasitic capacitance of the semiconductor device increases, hindering high speed operation. Parasitic capacitance can be reduced by intervening a thick semi-insulting or high resistance compound semiconductor layer between the conductive substrate and constituent elements of the semiconductor device.

Metal organic chemical vapor deposition (MOCVD) and hydride vapor phase epitaxy (H-VPE) are known as representative crystal growth methods for growing GaN based compound semiconductor.

Figure 2A:
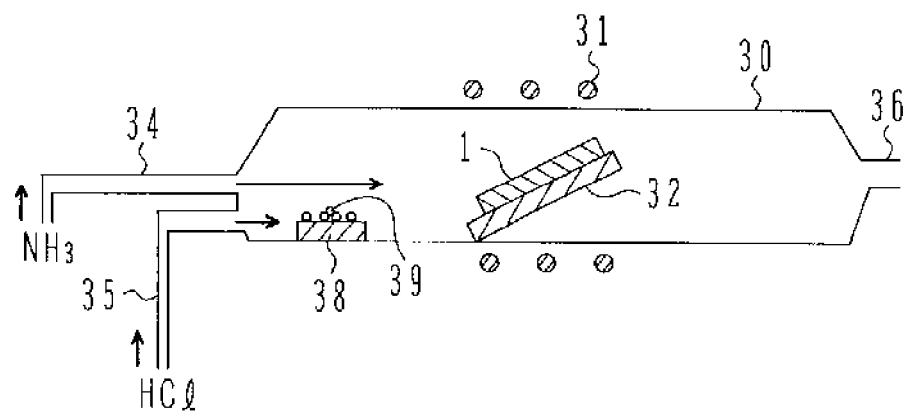
FIGS. 2A and 2B are schematic cross sectional views of a hydride VPE system and an MOCVD system.
Figure 2B:
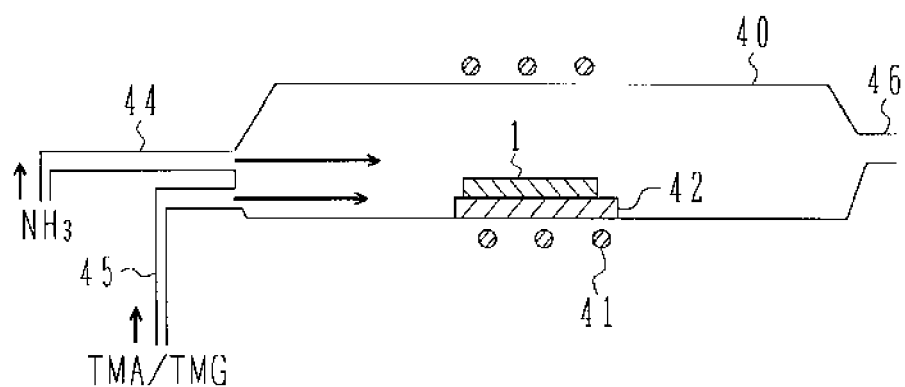

FIGS. 2A and 2B schematically show the structures of an H-VPE system and an MOCVD system.

FIG. 2A is a schematic cross sectional view showing the structure of an H-VPE system. An induction heating high frequency coil 31 is wound around the circumference of a quartz reaction tube 30, and a carbon susceptor 32 for placing thereon a substrate 1 is disposed inside the reaction tube. Two gas introducing pipes 34 and 35 are coupled to the reaction tube 30 at its upstream end shown at the left in FIG. 2A. A gas exhaust pipe 36 is connected at the downstream end of the reaction tube 30. A boat 38 is disposed at the upstream side of the susceptor 32 in the reaction tube 30, and accommodates therein a source 39 of a group III element of compound to be grown. For example, the source 39 is Al for growing AlN and Ga for growing GaN. Ammonium $NH_3$ as N source gas is introduced from the gas introducing pipe 34, and HCl is introduced from the gas introducing pipe 35. HCl reacts with the group III source 39 in the boat 38 to form group III element chloride AlCl. The source gases AlCl and $NH_3$ are transported to the substrate 1 and react on the substrate surface to grow AlN. Remaining gas is exhausted via the gas exhaust pipe 36 to a harmful gas removal tower.

FIG. 2B is a schematic cross sectional view showing the structure of an MOCVD system. A high frequency coil 41 is disposed outside a quartz reaction tube 40. A carbon suscep- tor 42 for placing a substrate 1 thereon is disposed inside the reaction tube 40. Two gas introducing pipes 44 and 45 are connected to the reaction tube 40 at its upstream side to supply compound semiconductor source gases. For example, $NH_3$ as N source gas is introduced from the gas introducing pipe 44, and organic group III compound source material such as trimethylaluminum, trimethylgallium or trimethylindium as group III element source gas is introduced from the introducing pipe 45. Crystal growth occurs on a substrate 1, and remaining gas is exhausted from a gas exhaust tube 46 to a harmful gas removal tower. If MOCVD is performed in a low pressure atmosphere, the gas exhaust tube 46 is connected to a vacuum pump and an exhaust port of the vacuum pump is connected to the harmful gas removal tower.

MOCVD has been used widely as a compound semiconductor crystal growth method, and can provide good crystallinity. Various techniques for impurity doping and thickness control have been established. However, growth speed is 1 μm/h at the highest.

H-VPE utilizes chloride as group III element source. Growth speed is as very high as several ten μm/h. Grown crystal layer has a high possibility of containing chlorine (Cl) derived from the source gas. In order to grow a thick compound semiconductor layer not thinner than 10 μm, growth speed of MOCVD is too low, and H-VPE capable of providing a high growth speed is suitable.

In forming a GaN-HEMT on a conductive SiC substrate, first, a semi-insulating or high resistance AlN layer having a thickness not thinner than 10 μm, e.g., 20 μm to 50 μm is formed on a conductive SiC substrate, preferably by H-VPE. If a thick AlN layer is grown by H-VPE, the advantages of reducing dislocations and improving crystal quality can also be obtained.

Figure 1A:
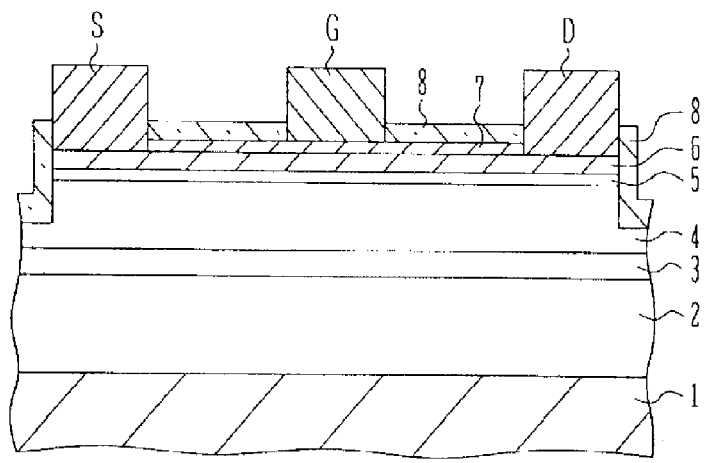
FIGS. 1A, 1B and 1C are schematic cross sectional views of GaN based HEMT's according to a first embodiment and a comparative example, and a graph showing comparison of secular changes in ohmic contact resistances.

FIG. 1A is a schematic cross sectional view showing the structure of a GaN-HEMT device of the first embodiment. A first AlN buffer layer 2 is grown to a thickness of, e.g., about 20 μm by H-VPE on a single crystal conductive SiC substrate 1 having the (0001) plane. The H-VPE system used is the system shown in FIG. 2A, and the group III element source material 39 in the boat 38 is Al. The conditions of H-VPE are, for example, as follows:

Pressure: Atmospheric pressure
Gas flow rate: HCl: 100 ccm (cubic centimeter per minute), $NH_3$: 10 LM (litter per minute)
Temperature: 1100° C.

Resistivity of the first AlN buffer layer 2 can be set considerably higher than, for example, $1 \times 10^5$ (represented as 1E5) Ωcm. However, the first AlN buffer layer 2 possibly contains chlorine. There is a high possibility of adverse effects if chlorine reaches, e.g., an electrode. A second AlN buffer layer 3 is grown on the thick first AlN buffer layer 2 by MOCVD, and GaN based HEMT constituent layers are grown on the second AlN buffer layer 3 by MOCVD.

The MOCVD conditions using the MOCVD system shown in FIG. 2B are set, for example, as follows:

Source material and its flow rate:
Trimethylgallium (TMG): 0 to 50 sccm (standard cubic centimeter per minute)
Trimethylaluminum (TMA): 0 to 50 sccm
ammonium ($NH_3$): 20 SLM (standard liter per minute)
n-type impurities: silane ($SiH_4$)
p-type impurities: bis-cyclopentadienyl magnesium (Cp2Mg)
Pressure: 100 torr
Temperature: 1100° C.

TMA and $NH_3$ are supplied to grow a second AlN buffer layer 3 not containing chlorine and having a thickness of, e.g., 300 nm by MOCVD on the first AlN layer 2 grown by H-VPE and possibly containing chlorine. Next, TMG and $NH_3$ are supplied (TMA not supplied) to grow a GaN layer 4 having a thickness of, e.g., 3 μm by MOCVD on the second AlN buffer layer 3. This GaN layer 4 is a non-doped layer and constitutes a region of an active layer (electron transfer layer) for transporting two-dimensional electron gas.

Continuously with the growth of the GaN layer 4, TMA as Al source gas is added by 5 sccm to grow a non-doped AlGaN layer 5 having a thickness of, e.g., 5 nm, and then by introducing also silane $SiH_4$ as source gas for n-type impurity Si, an n-type GaN layer 6 doped with Si at $4E18$ $cm^{-3}$ is grown to a thickness of 20 nm. The non-doped AlGaN layer 5 is used as a spacer layer for separating the n-type AlGaN layer 6 from the active layer 4. The n-type AlGaN layer 6 is used as an electron supply layer for supplying electrons as carriers to the active layer 4. In this manner, the basic structure of HEMT is formed. Essentially, each crystal layer grown by MOCVD does not contain Cl.

By stopping the supply of TMA, an n-type GaN layer 7 having a thickness of 7 nm and doped with Si at about, e.g., $5E18$ $cm^{-3}$ is grown as a protective layer on the n-type AlGaN layer 6. The n-type AlGaN layer 6 is covered with the n-type GaN layer 7 having a smooth surface.

The substrate is taken out of the MOCVD system, and an isolation region is formed by recess etching using $BCl_3$. A recess having a depth of, e.g., about 100 nm is formed for element isolation, extending from the surface through the n-type GaN layer 7, n-type AlGaN layer 6 and non-doped AlGaN layer 5, and partially entering the non-doped GaN layer 4. After element isolation, an SiN film 8 is deposited on the substrate surface by plasma CVD. Openings are formed through the SiN film 8 in source/drain electrode contact regions, and the n-type GaN layer 7 is etched and removed by dry etching using $Cl_2$. A source electrode S and a drain electrode D are formed by depositing a Ta layer having a thickness of, e.g., 10 nm and depositing an Al layer having a thickness of, e.g., 300 nm on the Ta layer, and performing, for example, lift-off. Annealing is performed at 600° C. to form ohmic contacts. The SiN film 8 in the gate contact area is etched, and a gate electrode is formed by depositing a Ni layer having a thickness of, e.g., 20 nm and an Au layer having a thickness of, e.g., 400 nm and performing lift-off. The gate electrode forms a Schottky contact.

By growing the semi-insulating AlN layer 2 thick, at least to a thickness of 10 μm, it can be expected that parasitic capacitance of HEMT can be suppressed. The AlN layer has the advantages that as it grows, dislocations reduce and crystallinity improves. From this viewpoint, it is particularly preferable to grow the AlN layer having a thickness of 20 μm or more. Although a thickness upper limit is determined by a warp and crack of a wafer, an upper limit may be set to, for example, 50 μm. A current collapse phenomenon that an on-resistance changes during operation can be avoided by forming the GaN protective layer 7 and SiN layer 8 on and above the n-type AlGaN electron supply layer 6. Since SiC has a high thermal conductivity, it is expected that a high breakdown voltage and high power operation can be realized.

Figure 3A:
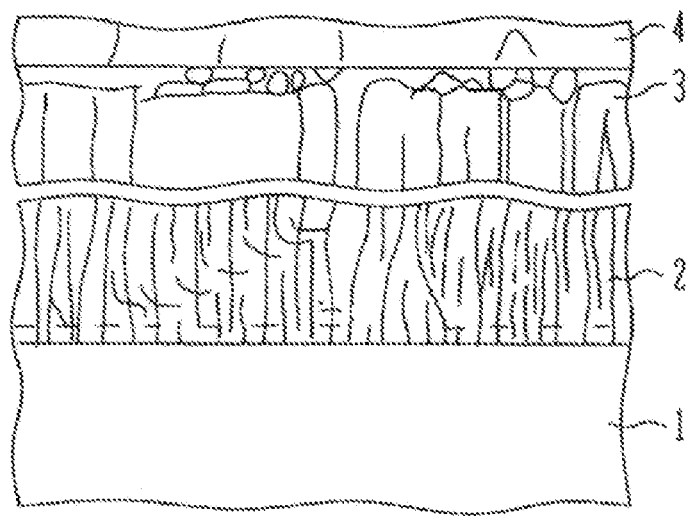
FIGS. 3A and 3B are a sketch of a grown crystal layer and a TEM image from which the sketch was drawn.
Figure 3B:
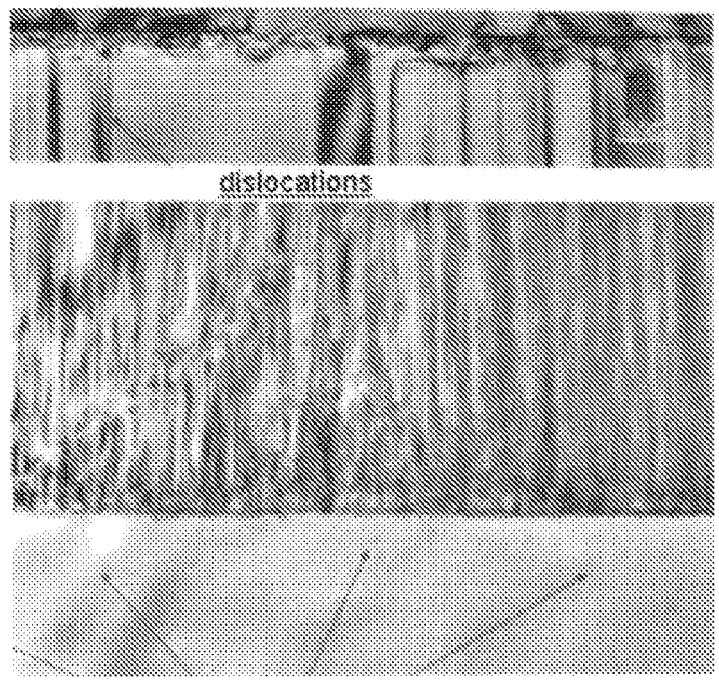

FIG. 3A is a sketch of an image of the first AlN buffer layer 2, second AlN buffer layer 3 and GaN layer 4 grown on and above the SiC substrate 1 observed with TEM. FIG. 3B is a TEM image from which the sketch was drawn. Since the first AlN buffer layer 2 is thick, the intermediate region is omitted. As the first AlN buffer layer 2 is grown, dislocations stretch in a vertical direction and its density reduces rapidly as the thickness increases. It was observed that as an AlN layer was grown to a thickness of about 20 μm by H-VPE, dislocation density reduced from about $1E10$ $cm^{-2}$ to about $1E5$ $cm^{-2}$. As the AlN layer 3 is grown by MOCVD on the AlN layer 2 grown by H-VPE, it is observed that dislocations are formed in a lateral direction. Namely, the AlN layer 2 by H-PVE has the physical properties quite different from those of the AlN layer 3 by MOCVD.

It was checked whether chlorine was captured when the AlN layer 2 is grown on the SiC substrate 1 by H-VPE. An energy dispersive X-ray fluorescence spectrometer (EDX) was used for measurements.

Figures 4A, 4B:
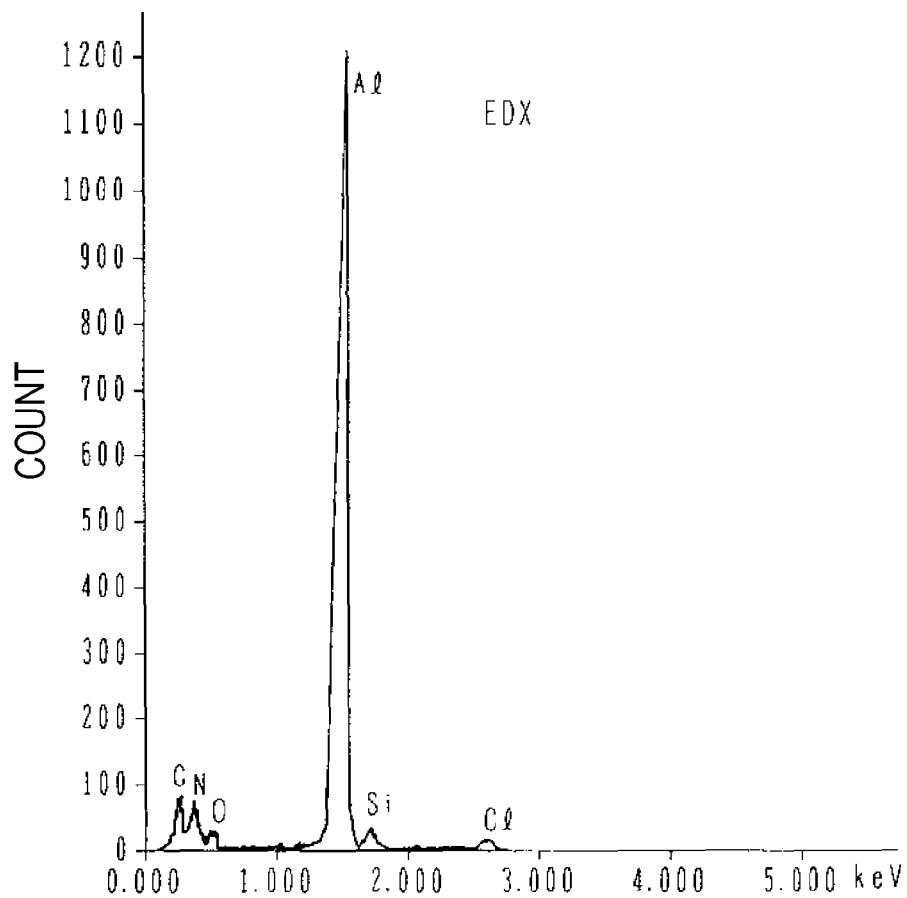
FIGS. 4A and 4B show a signal waveform of EDX used for composition measurements and a table showing compositions measured at four points (two points in AlN and two points in SiC) in a depth direction of a sample having an Al layer grown on a SiC substrate by H-VPE.

FIG. 4A shows a signal waveform of EDX. A Si peak is observed to the right of an Al peak, and a Cl peak is observed to the right of the Si peak. Compositions were measured by changing the depth, two points in the AlN layer and two points in the SiC substrate.

FIG. 4B is a table showing a list of compositions at four measurement points. C and N were excluded from measurement objects, and relative composition is calculated using a total sum of 100% of Si, Al and Cl. It can be understood that at any of four points, Si, Al and Cl are observed and Cl is diffused not only in the grown AlN layer 2 but also in the SiC substrate. Cl composition of 1.28% in the AlN layer 2 corresponds to a concentration of about $1E20$ $cm^{-3}$, and Cl composition of 0.31% corresponds to a concentration of about $2E19$ $cm^{-3}$. It indicates that the AlN layer grown by H-VPE contains Cl at a high concentration. It can also be understood that Al diffuses in the SiC substrate and Si diffuses in the AlN layer.

Figure 1B:
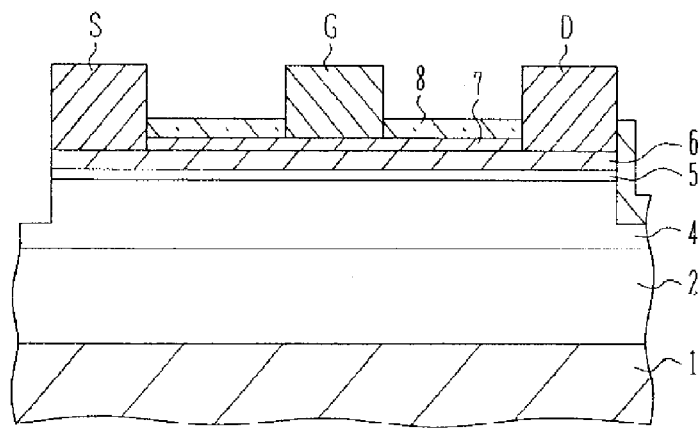

FIG. 1B is a cross sectional view showing the structure of GaN based HEMT according to the comparative example. As compared to the first embodiment, the second AlN buffer layer 3 is not grown. Similar to the first embodiment, a first AlN buffer layer 2 is grown to a thickness of about 20 μm on a single crystal conductive SiC substrate 1 having the (0001) plane, by H-VPE. The substrate is transported into a MOCVD system and a non-doped GaN layer having a thickness of 3 μm is grown on the first AlN buffer layer 2 by MOCVD.

Thereafter, similar to the first embodiment, following the growth of the GaN layer 4, supply of TMA as Al source gas starts to grow a non-doped AlGaN layer 5 having a thickness of, e.g., 5 nm, and then by introducing also silane ($SiH_4$) as source gas for n-type impurity Si, an n-type GaN layer 6 doped with Si at $4E18$ $cm^{-3}$ is grown to a thickness of 20 nm. By stopping the supply of TMA, an n-type GaN layer 7 having a thickness of 7 nm and doped with Si, e.g., at about $5E18$ $cm^{-3}$ is grown as a protective layer on the n-type AlGaN layer 6. The substrate is taken out of the MOCVD system, and an isolation region is formed by recess etching using $BCl_3$. After element isolation, an SiN film 8 is deposited on the substrate surface by plasma CVD. Openings are formed through the SiN film 8 in the source/drain electrode contact regions, and the n-type GaN layer 7 is etched and removed. A source electrode S and a drain electrode D are formed by depositing a Ta layer having a thickness of 10 nm and depositing an Al layer having a thickness of 300 nm on the Ta layer, and performing lift-off. Annealing is performed at 600° C. to form ohmic contacts. The SiN film 8 in the gate contact area is etched, and a gate electrode forming a Schottky contact is formed by depositing an Ni layer having a thickness of, e.g., 20 nm and an Au layer having a thickness of, e.g., 400 nm and performing lift-off.

Burn-in test was conducted at 250° C. for GaN based HEMT's of the first embodiment and comparative example to check a secular change in contact resistances of ohmic electrodes.

Figure 1C:
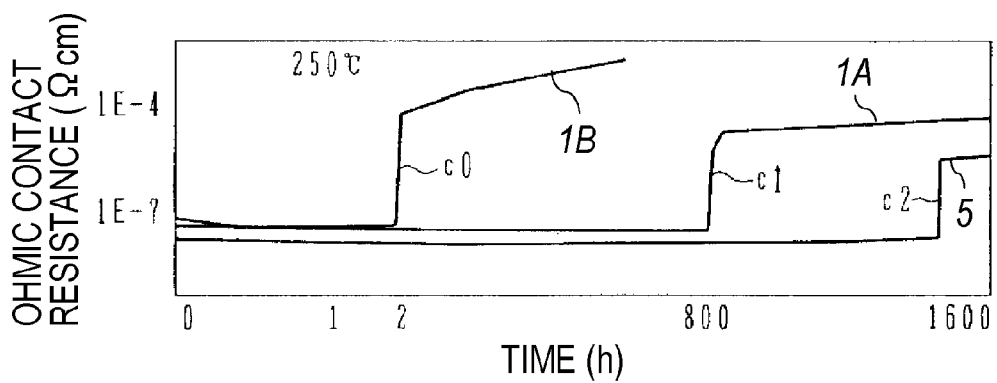

FIG. 1C is a graph showing the results of the burn-in test. The abscissa represents a burn-in time in the unit of hour (h), and the ordinate represents contact resistance in the unit of Ωcm. The contact resistance is preferably maintained in a range of ±15%. Curve c0 indicates the characteristics of the comparative example shown in FIG. 1B not having the second AlN buffer layer. The contact resistance increases rapidly and suddenly from 1E-7 to about 1E-4 in a burn-in time of about 2 hours. A lifetime at 250° C. is about 2 hours. It is considered that this lifetime is too short for practical use. It is considered that the ohmic electrode was damaged because of Cl diffusion shown in FIGS. 4A and 4B. By using H-VPE, a thick high resistance AlN buffer layer can be grown on an inexpensive (0001) conductive SiC substrate and the parasitic capacitance can be reduced. However, as a GaN device is formed on the AlN layer grown in this manner, it has been found that the contact resistance increases rapidly in a short time, resulting in a defective device.

Curve c1 indicates the characteristics of a sample of the first embodiment shown in FIG. 1A in which the second thin AlN buffer layer 3 is grown by MOCVD on the first thick AlN buffer grown by H-VPE. Contact resistance increases rapidly in burn-in time of about 800 hours. Lifetime at 250° C. is about 800 hours extending the lifetime of the comparative example by about 400 times.

It can be considered from the structures of grown layers shown in FIGS. 3A and 3B that as the AlN layer 3 is grown by MOCVD on the AlN layer 2 grown by H-VPE, vertical growth of dislocations are blocked by MOCVD, and dislocations are deflected to lateral or horizontal directions in MOCVD-grown layers, and that Cl diffusions are blocked thereby. Cl which cannot be blocked by the GaN layer having a thickness of about 3 µm could be blocked significantly by the AlN layer 3 having a thickness of 300 nm. It can be considered that the AlN layer grown by MOCVD and not containing Cl functions as a Cl diffusion blocking layer. Cl concentration in the AlN layer 3 grown by MOCVD was not higher than $1E15\ cm^{-3}$ at least in the upper region of the layer, and this concentration is negligible as compared to Cl concentration in the AlN layer grown by H-VPE. This state is described as "not containing Cl". It can be considered that the Cl diffusion blocking effect of the AlN layer may be influenced greatly by the presence of an interface. In addition, Oxygen at the interface between AlN layer 3 grown by MOCVD and AlN layer 2 grown by H-VPE disturbs Cl diffusion. Use of lamination of AlN and ALGaN layers is considered in place of a single AlN layer.

Figure 5:
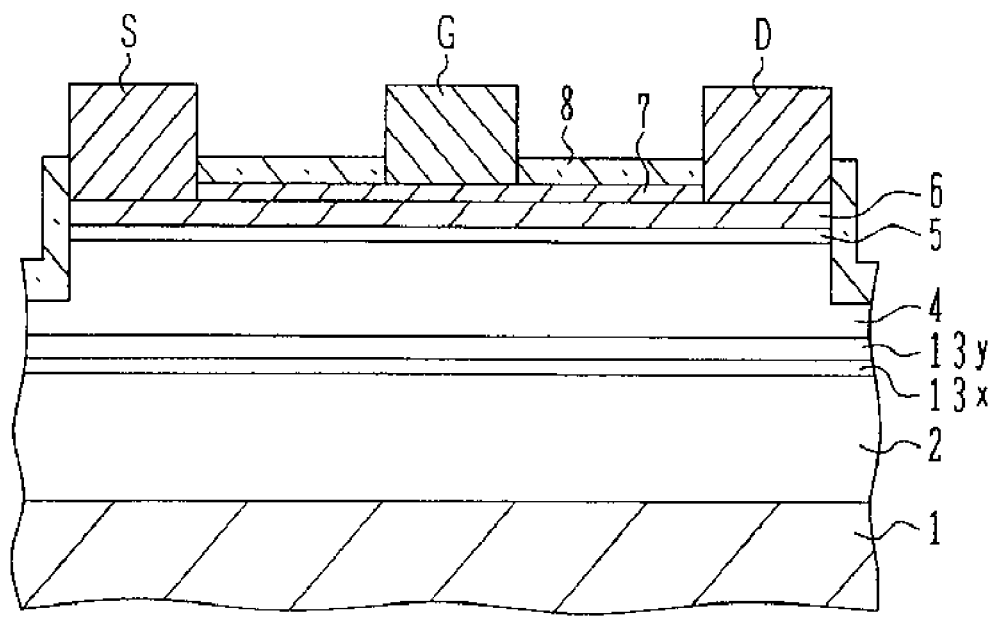
FIG. 5 is a schematic cross sectional view of a GaN based HEMT according to a second embodiment.

FIG. 5 is a schematic cross sectional view showing the structure of a GaN based HEMT according to the second embodiment. In place of the AlN layer 3 of the first embodiment having a thickness of 300 nm and grown by MOCVD, an AlN layer 13x of 100 nm thick and an AlGaN layer 13y of 200 nm thick were grown by MOCVD. Other structures are similar to those of the first embodiment. A sample of the second embodiment was formed. The effects of deflecting dislocations to lateral directions were observed also at an interface of AlN/AlGaN. Similar to the sample of the first embodiment, a burn-in test was conducted for the sample of the second embodiment to measure contact resistance of an ohmic electrode.

Curve c2 in FIG. 1C indicates the characteristics of samples of the second embodiment. Burn-in time maintaining good state extended to 1600 hours at 250° C. This burn-in time means, as converted to a temperature of 150° C., burn-in time of about 20 years. It can be considered that the hetero interface of AlN/AlGaN blocks Cl diffusion further. The AlGaN layer grown on the AlN layer may be an AlGaInN layer. It is expected that In addition will deflect dislocations further and Cl diffusion will be blocked further.

In the second embodiment, the AlN layer having a thickness of 100 nm and the AlGaN layer having a thickness of 200 nm were laminated. It is considered that there are various thicknesses of the layers realizing the Cl diffusion blocking effects.

Figure 6A:
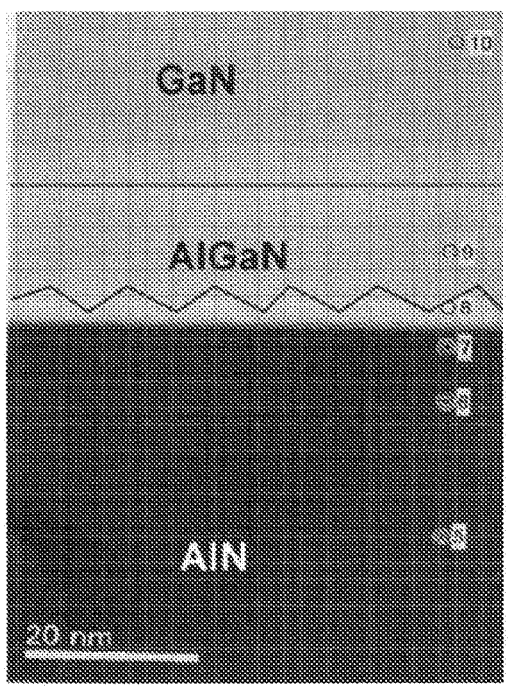
FIGS. 6A and 6B show a TEM cross sectional photograph of a lamination structure according to a modification of the second embodiment, and a signal waveform of EDX measured at a seventh sport.

FIG. 6A shows a TEM photograph of a device which, on an AlN layer grown by H-VPE, laminates an AlN layer having a thickness of 150 nm and an AlGaN layer having a thickness thinner than 20 nm, by MOCVD, and grows a GaN layer on the lamination. An initial growth layer of AlGaN layer is observed as having a stiff or uneven surface. This may be considered as a change in directions of dislocations. It can be considered that this initial growth layer has the large diffusion blocking effects. Cl concentration was measured at points shown in FIG. 6A with EDX, and the detected concentrations were all under the detection limit.

Figure 6B:
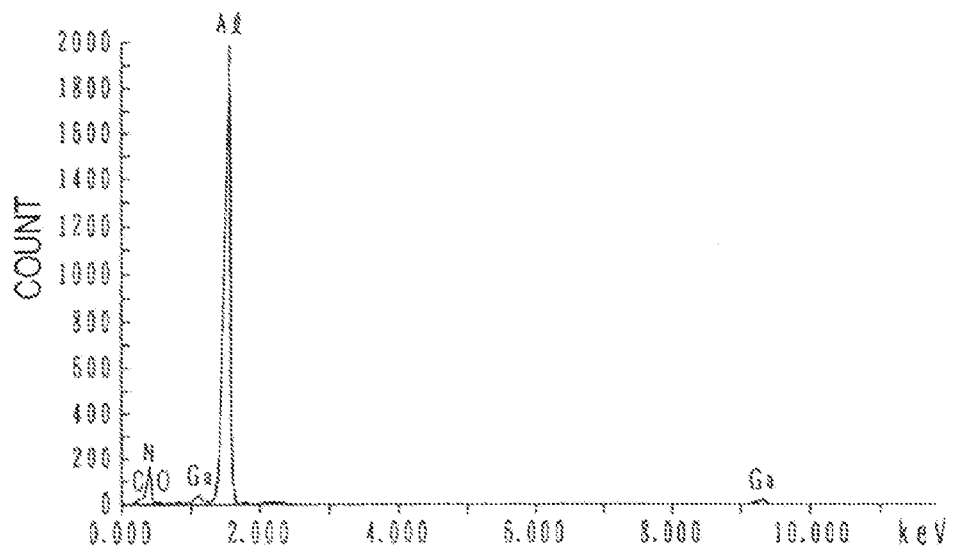

FIG. 6B shows an EDX spectrum measured at the spot 7 shown in FIG. 6A. Any Cl peak is not observed. It can be expected that Cl diffusion can be blocked satisfactorily even if thinner diffusion blocking layers are used.

The AlN layer grown by H-VPE has a gentle irregular surface visually observable although this surface is difficult to be observed by TEM.

It has been found that irregularity of the surface is reduced drastically and the surface is planarized, as the AlN layer and further AlGaN layer are grown by MOCVD on the AlN layer grown by H-VPE. It can be considered that as a layer is grown by MOCVD on the AlN layer grown by H-VPE, irregularity is relaxed. With a greater possibility, a layer to be grown by MOCVD is not limited to the AlN layer.

Figure 7A:
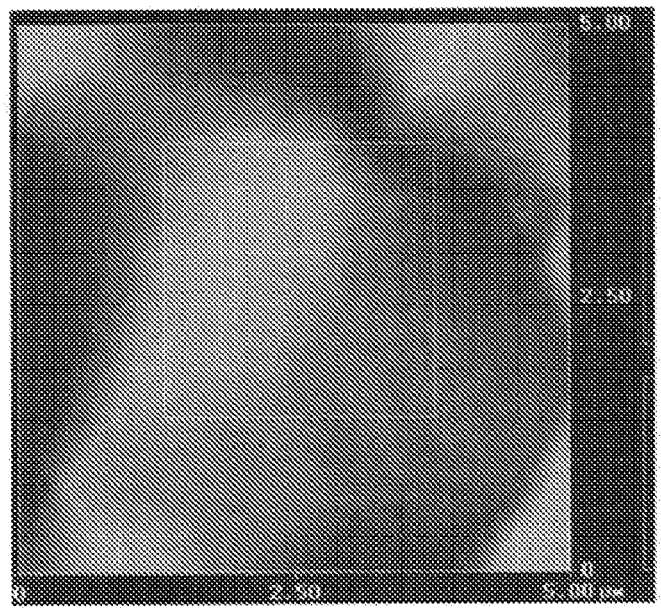
FIGS. 7A and 7B are microscopic photographs showing a growth surface according to the modification of the second embodiment.

FIG. 7A is an atomic microscope (AFM) top view of the surface of an AlN layer grown by H-VPE, indicating an area of a 5 µm square. A rectangle in FIG. 7A is an area of a 2.5 µm square. The surface is irregular, having a largest step of about 40 nm.

Figure 7B:

FIG. 7B is an AFM top view of the surface of a GaN layer grown by MOCVD on the AlN layer grown by H-VPE shown in FIG. 6A, indicating an area of a 5 µm square. The largest step reduced to about 2 nm. It can be seen that the surface planarizing effects can be obtained even if the GaN layer is grown by MOCVD on the AlN layer grown by H-VPE. This is considered as a modification of the second embodiment.

The surface planarizing effects by MOCVD growth following H-VPE growth are expected to provide large characteristic improving effects for semiconductor devices whose characteristics are influenced by surface irregularity.

For optical devices, a GaN based compound semiconductor layer having a thickness of about 3 to 4 µm is often used. As the modification of the second embodiment, an AlN layer having a thickness of 20 to 25 µm was grown by H-VPE on a conductive SiC substrate, and an AlN layer having a thickness of 100 nm, an AlGaN layer having a thickness of 200 nm and further a GaN layer having a thickness of 3 to 4 nm were grown by MOCVD on and above the H-VPE grown AlN layer.

Figure 8:
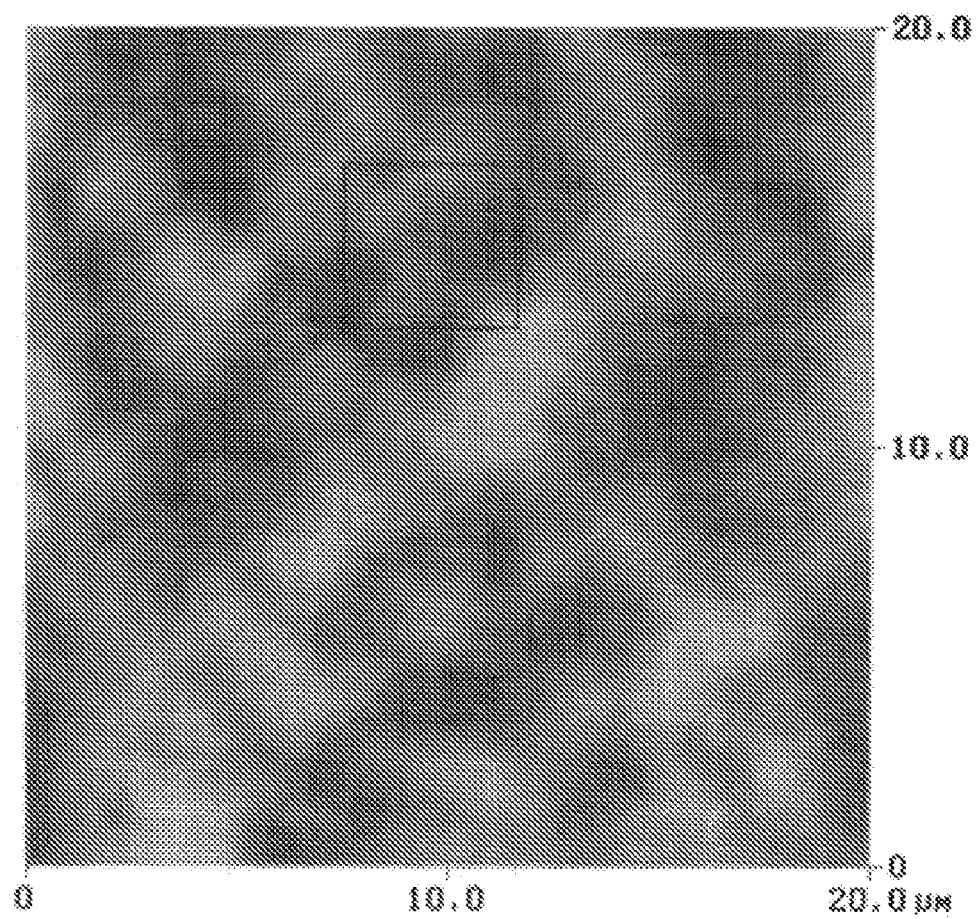
FIG. 8 is a microscopic photograph showing a growth surface according to the modification of the second embodiment.

FIG. 8 shows an AFM top view of the surface of the GaN layer, indicating an area of a 20 µm square. A planarized surface without spots is observed and it can be considered that dislocations are reduced.

Figure 9:
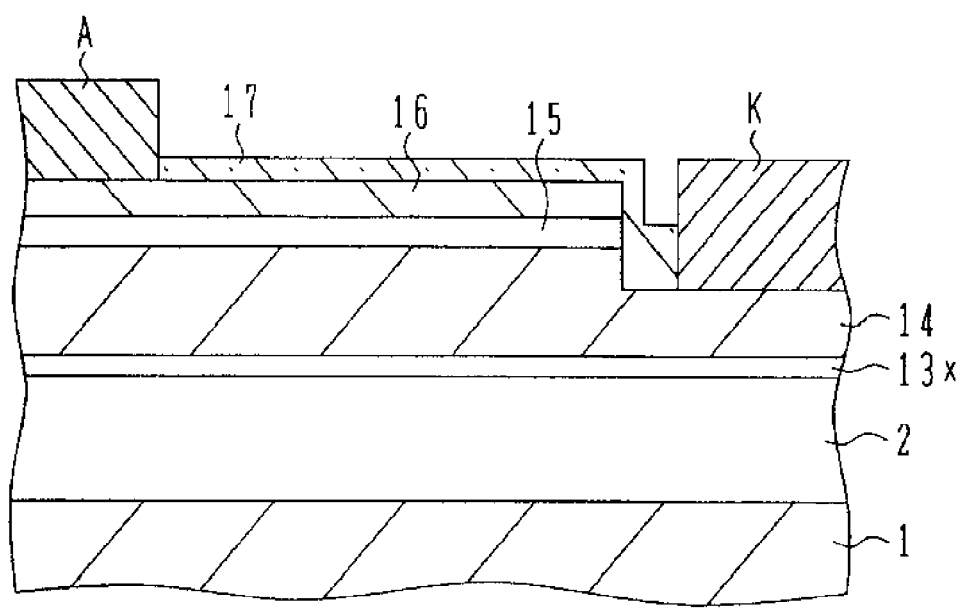
FIG. 9 is a schematic cross sectional view of a GaN based light emitting diode (LED) according to a third embodiment.

FIG. 9 is a schematic cross sectional view showing the structure of an ultraviolet light emitting diode (LED) according to the third embodiment. An AlN layer 2 is grown by H-VPE to a thickness of 20 µm on a conductive single crystal SiC substrate 1. Then, successive growth is done by MOCVD. Namely, an AlN layer 13x is grown to a thickness of 100 nm, an n-type AlGaN layer 14 doped with Si at $4E18\ cm^{-3}$ is grown to a thickness of 500 nm, a non-doped AlGaN layer 15 is grown to a thickness of 100 nm, and a p-type AlGaN layer 16 doped with Mg Si at 4E18 cm$^{-3}$ is grown to a thickness of 100 nm. A band gap of the non-doped AlGaN layer 15 is set narrower than those of the doped AlGaN layers 14 and 16 on both sides thereof to realize the structure of an emission layer sandwiched between clad layers. The n-type AlGaN layer 14 serves as the n-type region of LED and is considered as functioning as the layer for blocking Cl diffusion and planarizing the surface similar to the AlGaN layer 13y of the second embodiment.

After MOCVD, the substrate is taken out of the MOCVD system, recess etching is performed to an intermediate depth of the n-type AlGaN layer to expose the n-type AlGaN layer and achieve element isolation. An SiN layer 17 is formed on the substrate surface by plasma CVD. Openings are formed by Cl$_2$ etching using a resist mask, and an anode electrode A of an Ni/Au lamination and a cathode electrode K of a Ta/Al lamination are formed.

According to this embodiment, by growing the AlN layer 13x and AlGaN layer 14 by MOCVD on the AlN layer 2 grown by H-VPE, the surface planarizing effects can be obtained, dislocation density can be reduced to an order of 1E6 cm$^{-2}$, which is about two digits lower than a conventional case, and Cl diffusion can be suppressed so that Cl concentration is not higher than 1E15 cm$^{-3}$. It has been found that the reliability performance of ultraviolet LED has made the lifetime extended from 1,000 hours to 10,000 hours. The AlGaN layer on the AlN layer by MOCVD may be replaced with an AlGaInN layer. It can be considered that addition of In improves the flatness further, reduces dislocations, and improves the reliability further. By selecting the composition of AlGaInN, a blue LED can be formed similar to the ultraviolet LED. Instead of an i-type active layer of the pin structure, a quantum well structure, a multiple quantum well structure, a quantum dot structure or the like may also be used.

A light emitting device does not always require a high thermal conductivity of a SiC substrate. The substrate may be required to have transparency at a emission wavelength. It can be considered from this viewpoint that a sapphire substrate may be used instead of the SiC substrate. The sapphire substrate has lattice mismatch with GaN based compound semiconductor, and GaN based compound semiconductor crystal grown on the sapphire substrate has dislocations. It is expected that dislocations will be reduced considerably by growing a thick AlN layer by H-VPE on the sapphire substrate. The AlN layer by H-VPE contains Cl, and the characteristics could be thought to be adversely affected. However, by growing an AlN layer by MOCVD on the AlN layer grown by H-VPE, it is expected that Cl diffusion can be blocked considerably. If an AlN layer and an AlGaN layer (or AlGaInN layer) are laminated by MOCVD on the AlN layer grown by H-VPE, it is expected that the surface can be planarized and Cl diffusion can be suppressed further.

The present invention has been described in connection with the preferred embodiments. The invention is not limited only to the above embodiments. Although manufacturing a GaN based HEMT and LED have been described, electronic devices to be manufactured are not limited to HEMT and LED. Other electronic devices and optical devices may also be manufactured. Further, although growing a device constituent layer by MOCVD has been described, other method such as molecular beam epitaxy (MBE) may also be used. It will be apparent to those skilled in the art that other various modifications, improvements, combinations, and the like can be made.

The above-described embodiments are applicable to a GaN based compound semiconductor device and its manufacture method.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What are claimed are:

1. A compound semiconductor device comprising:
    a conductive SiC substrate;
    an AlN buffer layer having electrical resistivity higher than 1×10$^5$ Ωcm, formed on said conductive SiC substrate and containing Cl;
    a compound semiconductor buffer layer formed on said AlN layer which contains Cl, said compound semiconductor buffer layer not containing Cl; and
    a device constituent layer or layers formed above said compound semiconductor buffer layer not containing Cl, and electrically isolated from said conductive SiC substrate.

2. The compound semiconductor device according to claim 1, wherein said AlN buffer layer containing Cl has a thickness not thinner than 10 μm.

3. The compound semiconductor device according to claim 1, wherein said compound semiconductor buffer layer is an AlN layer.

4. The compound semiconductor device according to claim 1, wherein said compound semiconductor buffer layer is a GaN layer.

5. The compound semiconductor device according to claim 3, further comprising an AlGaInN layer or AlGaN layer not containing Cl and formed on said compound semiconductor buffer layer.

6. The compound semiconductor device according to claim 3, wherein said device constituent layers include a non-doped GaN layer, a non-doped AlGaN layer and an n-type AlGaN layer, and constitute a HEMT.

7. The compound semiconductor device according to claim 6, wherein said device constituent layers further include an n-type GaN layer formed on said n-type AlGaN layer and an SiN layer formed on said n-type GaN layer.

8. An optical compound semiconductor device comprising:
    a substrate of conductive SiC;
    an AlN buffer layer having electrical resistivity higher than 1×10$^5$ Ωcm, formed on said substrate and containing Cl;
    a compound semiconductor buffer layer formed on said AlN layer which contains Cl, said compound semiconductor buffer layer not containing Cl; and
    an optical device constituent layer or layers formed above said compound semiconductor buffer layer not containing Cl, and electrically isolated from said conductive SiC substrate.

9. The optical compound semiconductor device according to claim 8, wherein a surface of said compound semiconductor buffer layer is more flat than a surface of said AlN buffer layer.

10. The optical compound semiconductor device according to claim 8, wherein said compound semiconductor buffer layer is an AlN layer.

11. The optical compound semiconductor device according to claim 8, wherein said compound semiconductor buffer layer is a GaN layer.

12. The optical compound semiconductor device according to claim 10, wherein said optical device constituent layers include a first AlGaInN layer not containing Cl and formed on said compound semiconductor buffer layer.

13. The optical compound semiconductor device according to claim 12, wherein said first AlGaInN layer is doped with impurities of a first conductivity type, and said optical device constituent layers further include a non-doped AlGaInN emission layer formed on said first AlGaInN layer and a second AlGaInN layer formed on said non-doped AlGaInN emission layer and doped with impurities of a second conductivity type opposite to the first conductivity type.

14. The optical compound semiconductor device according to claim 13, wherein said AlGaInN emission layer has a band gap narrower than those of said first and second AlGaInN layers.

15. The compound semiconductor device according to claim 7, further comprising:
a gate electrode formed on said n-type GaN layer;
a pair of openings formed through said n-type GaN layer at opposing positions sandwiching said gate electrode, and exposing said n-type AlGaN layer; and
a pair of current electrodes formed on said n-type AlGaN layer exposed in said openings.

16. The optical compound semiconductor device according to claim 13, further comprising:
an opening formed through said second AlGaInN layer and said non-doped AlGaInN emission layer, and exposing said first AlGaInN layer;
one electrode formed on said second AlGaInN layer; and
another electrode formed on said first AlGaInN layer exposed in said opening.

17. An optical compound semiconductor device comprising:
a substrate of conductive SiC or sapphire;
an AlN buffer layer having electrical resistivity higher than $1 \times 10^5$ Ωcm, formed on said substrate and containing Cl;
a compound semiconductor buffer layer formed on said AlN layer which contains Cl, said compound semiconductor buffer layer not containing Cl; and
an optical device constituent layer or layers formed above said compound semiconductor buffer layer not containing Cl,
wherein said compound semiconductor buffer layer is an AlN layer,
wherein said optical device constituent layers include a first AlGaInN layer not containing Cl and formed on said compound semiconductor buffer layer,
wherein said first AlGaInN layer is doped with impurities of a first conductivity type, and said optical device constituent layers further include a non-doped AlGaInN emission layer formed on said first AlGaInN layer and a second AlGaInN layer formed on said non-doped AlGaInN emission layer and doped with impurities of a second conductivity type opposite to the first conductivity type, and
wherein said AlGaInN emission layer has a band gap narrower than those of said first and second AlGaInN layers.

18. An optical compound semiconductor device comprising:
a substrate of conductive SiC or sapphire;
an AlN buffer layer having electrical resistivity higher than $1 \times 10^5$ Ωcm, formed on said substrate and containing Cl;
a compound semiconductor buffer layer formed on said AlN layer which contains Cl, said compound semiconductor buffer layer not containing Cl; and
an optical device constituent layer or layers formed above said compound semiconductor buffer layer not containing Cl,
wherein said compound semiconductor buffer layer is an AlN layer,
wherein said optical device constituent layers include a first AlGaInN layer not containing Cl and formed on said compound semiconductor buffer layer,
wherein said first AlGaInN layer is doped with impurities of a first conductivity type, and said optical device constituent layers further include a non-doped AlGaInN emission layer formed on said first AlGaInN layer and a second AlGaInN layer formed on said non-doped AlGaInN emission layer and doped with impurities of a second conductivity type opposite to the first conductivity type, and further comprising:
an opening formed through said second AlGaInN layer and said non-doped AlGaInN emission layer, and exposing said first AlGaInN layer;
one electrode formed on said second AlGaInN layer; and
another electrode formed on said first AlGaInN layer exposed in said opening.

19. A compound semiconductor device comprising:
a conductive SiC substrate;
an AlN buffer layer having electrical resistivity higher than $1 \times 10^5$ Ωcm, formed on said conductive SiC substrate and containing Cl;
a compound semiconductor buffer layer formed on said AlN layer which contains Cl, said compound semiconductor buffer layer not containing Cl; and
a device constituent layer or layers formed above said compound semiconductor buffer layer not containing Cl,
wherein said compound semiconductor buffer layer is an AlN layer,
wherein said device constituent layers include a non-doped GaN layer, a non-doped AlGaN layer and an n-type AlGaN layer, and constitute a HEMT,
wherein said device constituent layers further include an n-type GaN layer formed on said n-type AlGaN layer and an SiN layer formed on said n-type GaN layer, and further comprising:
a gate electrode formed on said n-type GaN layer;
a pair of openings formed through said n-type GaN layer at opposing positions sandwiching said gate electrode, and exposing said n-type AlGaN layer; and
a pair of current electrodes formed on said n-type AlGaN layer exposed in said openings.

* * * * *